United States Patent
Yu et al.

(10) Patent No.: US 11,545,542 B2
(45) Date of Patent: Jan. 3, 2023

(54) DISPLAY PANEL, DISPLAY DEVICE, AND METHOD FOR MANUFACTURING DISPLAY PANEL

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yong Yu, Beijing (CN); Chang Zhang, Beijing (CN); Lixia Shen, Beijing (CN); Qun Jia, Beijing (CN); Xuerui Gong, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 30 days.

(21) Appl. No.: 16/643,619

(22) PCT Filed: Jan. 22, 2019

(86) PCT No.: PCT/CN2019/072694
§ 371 (c)(1),
(2) Date: Mar. 2, 2020

(87) PCT Pub. No.: WO2020/150900
PCT Pub. Date: Jul. 30, 2020

(65) Prior Publication Data
US 2021/0225996 A1 Jul. 22, 2021

(51) Int. Cl.
*H01L 27/32* (2006.01)
*H01L 51/56* (2006.01)

(52) U.S. Cl.
CPC .......... *H01L 27/3279* (2013.01); *H01L 51/56* (2013.01); *H01L 27/3213* (2013.01); *H01L 2227/323* (2013.01)

(58) Field of Classification Search
CPC ................. H01L 27/3279; H01L 51/56; H01L 2227/323
(Continued)

(56) References Cited

U.S. PATENT DOCUMENTS

| 9,911,382 B2 | 3/2018 | Yin et al. |
| 2003/0001513 A1* | 1/2003 | Onozawa ............... G09G 3/296 315/169.3 |

(Continued)

FOREIGN PATENT DOCUMENTS

| CN | 104409046 A | 3/2015 |
| CN | 105576001 A | 5/2016 |

(Continued)

OTHER PUBLICATIONS

English Machine Translation of CN 107887421 (Year: 2018).*
English Machine Translation of CN 107910352 (Year: 2018).*

*Primary Examiner* — Dzung Tran
(74) *Attorney, Agent, or Firm* — Dilworth & Barrese, LLP; Michael J. Musella, Esq.

(57) ABSTRACT

A display panel, a display device, and a method for manufacturing a display panel are disclosed. The display panel includes a first power bus and a first power line. A display region of the display panel includes a first region and a second region, the first region and the second region include a plurality of first pixel units, respectively, the first power bus is between the first region and the second region, and the first power line is electrically connected to the first power bus and extends from the first power bus to the first region (Continued)

and the second region, respectively, so as to supply power to the plurality of first pixel units in the first region and the second region, respectively.

16 Claims, 7 Drawing Sheets

(58) Field of Classification Search
 USPC .......................................................... 257/88
 See application file for complete search history.

(56) References Cited

U.S. PATENT DOCUMENTS

| | | | |
|---|---|---|---|
| 2004/0004444 A1 | 1/2004 | Choi et al. | |
| 2006/0017716 A1* | 1/2006 | Aoki | G09G 3/3275 |
| | | | 345/204 |
| 2006/0077144 A1* | 4/2006 | Eom | G09G 3/32 |
| | | | 345/82 |
| 2007/0200842 A1* | 8/2007 | Tokuda | H05B 33/04 |
| | | | 345/204 |
| 2014/0300937 A1* | 10/2014 | Choe | G09G 3/3225 |
| | | | 358/480 |
| 2016/0126304 A1 | 5/2016 | Cho et al. | |

FOREIGN PATENT DOCUMENTS

| | | |
|---|---|---|
| CN | 106653811 A | 5/2017 |
| CN | 107887421 A | 4/2018 |
| CN | 107910352 A | 4/2018 |

* cited by examiner

DISPLAY PANEL, DISPLAY DEVICE, AND METHOD FOR MANUFACTURING DISPLAY PANEL

TECHNICAL FIELD

Embodiments of the present disclosure relate to a display panel, a display device, and a method for manufacturing a display panel.

BACKGROUND

Compared with traditional liquid crystal panels, organic light-emitting diode (OLED) display panels have advantages such as a faster response speed, a higher contrast, a wider viewing angle, and a lower power consumption, and have been increasingly used for high-performance display. OLED display panels can be used in various electronic products such as a mobile phone, a tablet computer, a television, a laptop computer, etc.

SUMMARY

At least an embodiment of the present disclosure provides a display panel, and the display panel includes a first power bus and a first power line; and a display region of the display panel includes a first region and a second region, the first region and the second region include a plurality of first pixel units, respectively, the first power bus is between the first region and the second region, and the first power line is electrically connected to the first power bus and extends from the first power bus to the first region and the second region, respectively, so as to supply power to the plurality of first pixel units in the first region and the second region, respectively.

For example, in the display panel provided by an embodiment of the present disclosure, the first pixel units comprised in the first region and the first pixel units comprised in the second region are identical in number.

For example, the display panel provided by an embodiment of the present disclosure further includes a power management circuit and a first power input line, the first power input line connects the first power bus to the power management circuit, and the power management circuit is configured to provide a power supply voltage to the first power input line.

For example, in the display panel provided by an embodiment of the present disclosure, the first power input line connects a first terminal and a second terminal, which are opposite to each other, of the first power bus to the power management circuit, respectively.

For example, the display panel provided by an embodiment of the present disclosure further includes a base substrate, the first power bus, the first power line, the first power input line, and the first pixel units are on the base substrate, and the first power line and the first power bus are formed in an identical layer with respect to the base substrate.

For example, the display panel provided by an embodiment of the present disclosure further includes a base substrate, the first power bus, the first power line, the first power input line, and the first pixel units are on the base substrate, and the first power line and the first power bus are formed in different layers with respect to the base substrate and are electrically connected to each other through a via hole.

For example, in the display panel provided by an embodiment of the present disclosure, an insulating layer is provided between the first power line and the plurality of first pixel units, via hole structures are provided in the insulating layer, and the first power line is connected to the plurality of first pixel units through the via hole structures, respectively.

For example, in the display panel provided by an embodiment of the present disclosure, the first power line forms a mesh structure.

For example, the display panel provided by an embodiment of the present disclosure further includes a second power bus and a second power line; and the display region further includes a third region and a fourth region, the third region and the fourth region include a plurality of second pixel units, respectively, the second power bus is between the third region and the fourth region, and the second power line is electrically connected to the second power bus and extends from the second power bus to the third region and the fourth region, respectively, so as to supply power to the plurality of second pixel units in the third region and the fourth region, respectively.

For example, in the display panel provided by an embodiment of the present disclosure, the first power bus is substantially parallel to the second power bus, and the first power line is substantially parallel to the second power line.

For example, the display panel provided by an embodiment of the present disclosure further includes a second power input line, the second power input line connects the second power bus to the power management circuit, and the power management circuit is further configured to provide the power supply voltage to the second power input line.

For example, in the display panel provided by an embodiment of the present disclosure, the second power input line connects a first terminal and a second terminal, which are opposite to each other, of the second power bus to the power management circuit, respectively.

For example, in the display panel provided by an embodiment of the present disclosure, the second power line forms a mesh structure.

At least an embodiment of the present disclosure further provides a display device, and the display device includes the display panel provided by any one of the embodiments of the present disclosure.

At least an embodiment of the present disclosure further provides a method for manufacturing a display panel, including: forming a power bus and a power line on the display panel, and forming a plurality of pixel units in a display region of the display panel; and the display region includes a first region and a second region, the power bus is between the first region and the second region, and the power line extends from the power bus to the first region and the second region, respectively, so as to supply power to the plurality of pixel units in the first region and the second region, respectively.

For example, the method for manufacturing the display panel provided by an embodiment of the present disclosure further includes: forming a power input line, for connecting the power bus to a power management circuit, on the display panel, and the power management circuit is configured to provide a power supply voltage to the power input line.

For example, the method for manufacturing the display panel provided by an embodiment of the present disclosure further includes: providing a base substrate; the power bus, the power line, the power input line, and the pixel units are formed on the base substrate; and the power line and the power bus are formed in an identical layer with respect to the base substrate, or the power line and the power bus are formed in different layers with respect to the base substrate and are electrically connected to each other through a via hole.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "compris- ing," "include," "including," etc., are intended to specify that the elements or the objects stated before these terms encompass the elements or the objects and equivalents thereof listed after these terms, but do not preclude the other elements or objects.

Generally, the power supply wiring, which provides a power supply voltage, of the organic light-emitting diode (OLED) display panel is directly provided from a flexible printed circuit (FPC) bonding region to a display region to drive circuits, and power lines need to extend from one side to the opposite side of the display region. Therefore, during the transmission of the power supply voltage through the internal power supply circuit in the display region, because of the voltage drop, the power supply voltage is gradually attenuated from the power supply voltage providing terminal, thereby causing the luminance of the display region to be gradually attenuated from the power supply voltage providing terminal, so that the long-range uniformity (LRU) of the display panel is reduced, the luminance uniformity of the display image of the display panel is reduced, and there is a risk that the method detecting limit (MDL) of the luminance of the display panel is below the user requirements where the display panel is tested.

At least an embodiment of the present disclosure provides a display panel. The power supply wiring design of the display panel allows the power supply voltage to be directly provided from the FPC bonding region to the middle position of the display region by lines, and then the power supply wiring extends from the middle position of the display region to the top and bottom of the display panel, thereby reducing the transmission path of the power supply voltage in the display region, reducing the voltage drop during the transmission of the power supply voltage, improving the long-range uniformity (LRU) of the display panel, allowing the luminance of the display panel to be more uniform, and facilitating achieving a better image display effect.

In addition, where a luminance test of the display panel is performed in the industry, a power consumption test at a fixed luminance is usually performed in the middle region of the display panel, and the main viewing region of the user when viewing the display panel is also the middle region of the display panel. Therefore, in the case where the middle region of the display region is provided with the same required luminance, the power consumption of the display panel provided by some embodiments of the present disclosure is definitely lower than that of the display panel with the traditional power supply wiring design, so that the overall power consumption of the product is effectively reduced and the risk that the method detecting limit (MDL) of the luminance of the display panel is below the user requirements is avoided.

At least an embodiment of the present disclosure further provides a display device including the above display panel, and a method for manufacturing the above display panel.

Hereinafter, the embodiments of the present disclosure are described in detail with reference to the accompanying drawings. It should be noted that the same reference numerals in different drawings are used to refer to the same described components.

Figure 1:
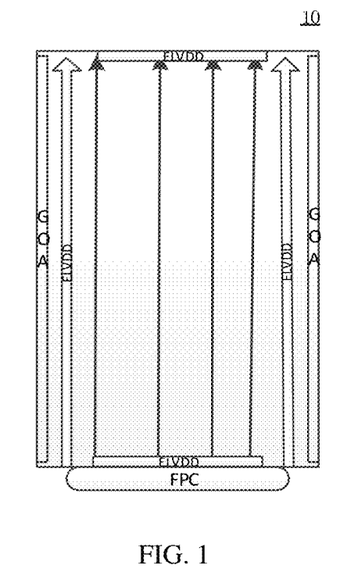
FIG. 1 is a schematic planar diagram of a power supply wiring design of an organic light-emitting diode (OLED) display panel.

FIG. 1 is a schematic planar diagram of a power supply wiring design of an organic light-emitting diode (OLED) display panel 10. As illustrated in FIG. 1, the OLED display panel 10 includes a display region and a peripheral region outside the display region. The peripheral region may be provided with, for example, a gate driving circuit (e.g., a GOA (Gate on Array) driving circuit), a data driving circuit, a bonding region, etc. of the display panel 10. The display region includes pixel units in an array arrangement, and the pixel unit is driven to emit light by the power supply voltage according to the received scanning signal and the received data signal, thereby implementing display on the whole. The power supply wiring is directly provided from the FPC bonding region at the bottom of the display panel 10 to the display region to drive the circuits, and the power supply wiring needs to extend from the bottom of the display region to the opposite side. Therefore, during the transmission of the power supply voltage ELVDD in the display region, because of the voltage drop, the power supply voltage ELVDD is inevitably gradually attenuated, and the luminance of the display region is gradually attenuated from the bottom to the top of the display region according to the luminance formula, $I=K/2(V_{ELVDD}-V_{DATA})^2$, of the pixel unit of the OLED display panel, so that the luminance uniformity of the display panel 10 is reduced.

Figure 2:
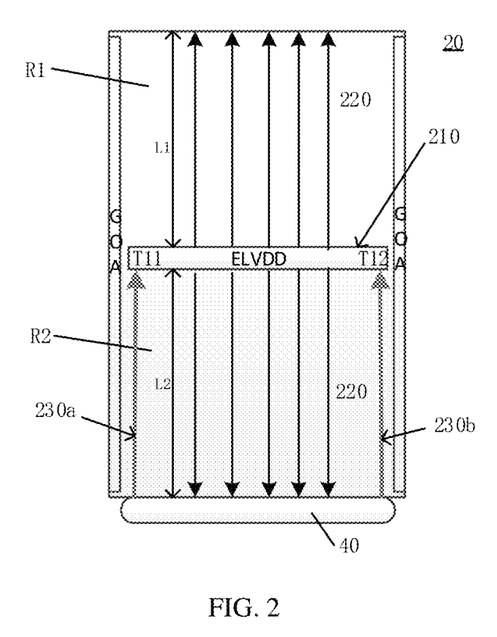
FIG. 2 is a schematic planar diagram of a power supply wiring design of a display panel provided by some embodiments of the present disclosure.

FIG. 2 is a schematic planar diagram of a power supply wiring design of a display panel provided by some embodiments of the present disclosure. As illustrated in FIG. 2, the display panel 20 includes a first power bus 210, a first power line 220, a first power input line 230, and a power management circuit 40. A display region of the display panel 20 includes a first region R1 and a second region R2, and the first region R1 and the second region R2 include pixel units, respectively. The pixel unit includes a thin film transistor (such as a switching transistor, a driving transistor, etc.), a capacitor, a light-emitting component, etc., and is driven to emit light by a power supply voltage according to a received scanning signal and a received data signal, thereby implementing display on the whole. The light-emitting component is, for example, an organic light-emitting diode (OLED), a quantum dot light-emitting diode (PLED), etc. In the following, the OLED display panel is taken as an example for description, but the embodiments of the present disclosure are not limited in this aspect. A peripheral region is located outside the display region and may include a gate driving circuit (such as a GOA driving circuit), a data driving circuit, a bonding region, etc., and for example, GOA driving circuits are provided in the peripheral region on both sides of the display region. For example, the power management circuit 40 is electrically connected to the power input line in the bonding region, so as to provide a power supply voltage (ELVDD). For example, the power management circuit 40 may be directly provided in the bonding region to implement electrical connection, or the power management circuit 40 may be electrically connected to the power input line through a flexible printed circuit (FPC) provided in the bonding region to implement electrical connection.

The first power bus 210 is located between the first region R1 and the second region R2. For example, the number of pixel units included in the first region R1 is equal to the number of pixel units included in the second region R2, that is, a size L1, in a direction perpendicular to an extending direction of the first power bus 210, of the first region R1 is equal to a size L2, in the direction perpendicular to the extending direction of the first power bus 210, of the second region R2. That is, the first power bus 210 is located at a middle position of the display region. A first terminal T11 and a second terminal T12 of the first power bus 210 are connected to the power management circuit 40 located in the bonding region through two first power input lines 230a and 230b, respectively, so that the power supply voltage ELVDD provided by the power management circuit 40 is transmitted to the first power bus 210. The first power line 220 is electrically connected to the first power bus 210 and extends from the first power bus 210 to the first region R1 and the second region R2, respectively, to cover the entire display region of the display panel 20, so that the power supply voltage ELVDD applied to the first power bus 210 at the middle position of the display region is transmitted to the top and bottom of the display panel 20 through the first power line 220. Therefore, the transmission path of the power supply voltage ELVDD in the display region is reduced, and accordingly, the attenuation of the power supply voltage ELVDD during the transmission is reduced. In addition, in the case where power input lines are provided at opposite terminals of the first power bus 210, the voltage drop of the power supply voltage ELVDD can be further reduced. Compared with the display panel 10 with the power supply wiring design illustrated in FIG. 1, the display panel 20 provided by the above embodiments of the present disclosure allows the transmission path of the power supply voltage ELVDD to be reduced by 50% under the same size and other design specifications, so that the voltage drop of the power supply voltage ELVDD during the transmission in the display region is reduced by 50%, and the long-range uniformity (LRU) of the display panel 20 can be twice that of the display panel 10 illustrated in FIG. 1 according to the luminance formula, $I=K/2(V_{ELVDD}-V_{DATA})^2$, of the OLED display panel. Therefore, the power supply wiring design of the display panel 20 effectively alleviates the luminance attenuation, which is caused by the voltage drop, of the display region during the transmission of the power supply voltage ELVDD, improves the luminance uniformity of the display region, and facilitates achieving a better image display effect.

In addition, in the embodiments, the first power bus 210 is located at the middle position of the display region. Where the luminance test of the display panel is performed in the industry, the middle region of the display panel is usually selected to perform the power consumption test at a fixed luminance, and the main viewing region of the user when viewing the display panel is also the middle region of the display panel, so that in the case where a center point of the display region reaches the same luminance, the power consumption of the display panel 20 in the embodiments is definitely lower than that of the display panel 10 with the power supply wiring design illustrated in FIG. 1, thereby effectively reducing the overall power consumption of the product and avoiding the risk that the method detecting limit (MDL) of the luminance of the display panel is below the user requirements.

In the embodiments, the first region R1 and the second region R2 of the display panel 20 include a plurality of pixel units, respectively, and each pixel unit is respectively connected to the first power line 220 extending to the first region R1 and the second region R2. In the following, the connection of the power supply wiring of the display panel 20 to each pixel unit in the display region is described in detail with reference to FIG. 3 to FIG. 6.

Figure 3:
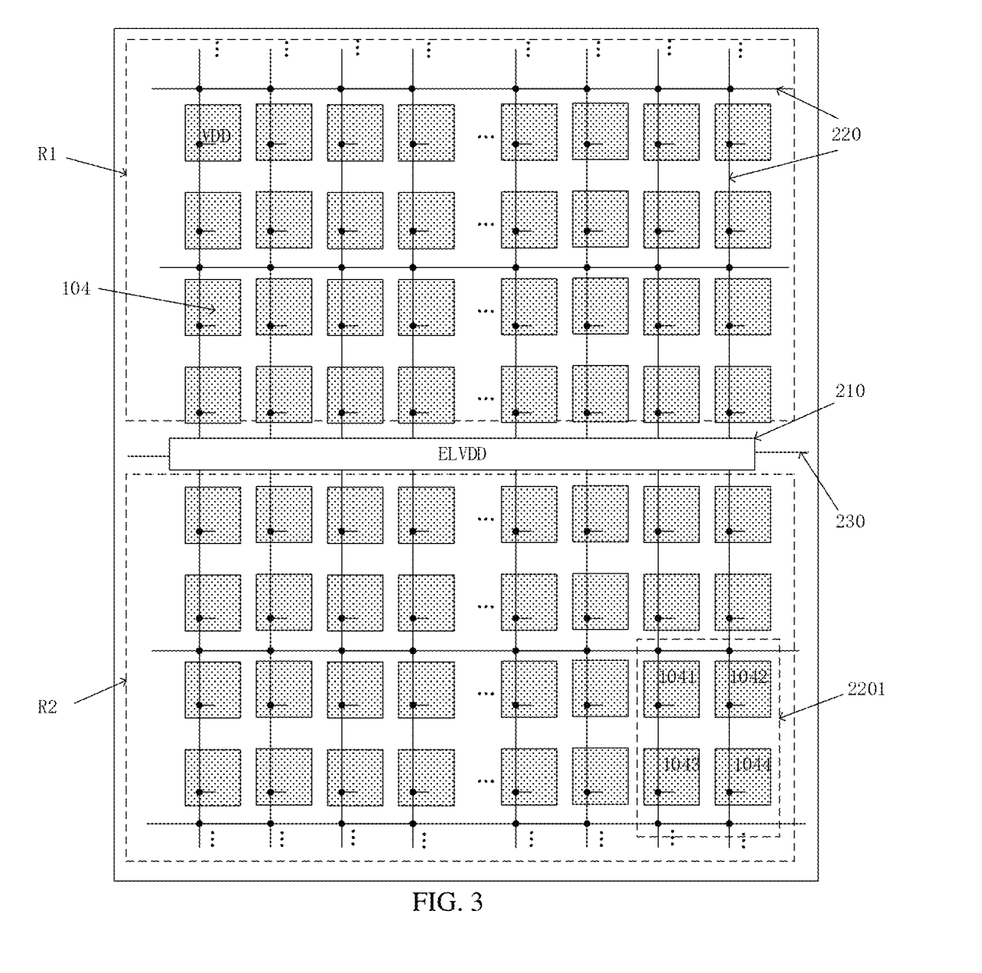
FIG. 3 is a schematic planar diagram of first power lines of a mesh structure of a display panel provided by some embodiments of the present disclosure.

FIG. 3 is a schematic planar diagram of first power lines 220 of a mesh structure of the display panel 20 provided by some embodiments of the present disclosure. As illustrated in FIG. 3, the first region R1 and the second region R2 include a plurality of first pixel units 104, respectively, and a plurality of first power lines 220 extend from the first power bus 210 and are connected to each of the first pixel units 104 in the first region R1 and the second region R2, respectively, to provide the power supply voltage ELVDD to each of the first pixel units 104. The plurality of first power lines 220 include a plurality of mesh structures 2201, and the power supply voltage ELVDD is transmitted to each of the first pixel units 104 through the mesh structures 2201, so as to allow the transmission load of the power supply voltage ELVDD to be reduced and allow the power supply voltage ELVDD to be uniformly transmitted to each of the first pixel units 104 during the transmission in the display region, thereby improving the luminance uniformity of the display panel 20 and acquiring a better display image.

It should be noted that, in the embodiments of FIG. 3, each mesh structure 2201 provides the power supply voltage ELVDD to four corresponding pixel units (for example, the first pixel units 1041, 1042, 1043, and 1044) in the display region, but the embodiments of the present disclosure are not limited in this aspect. For example, each mesh structure 2201 may correspond to only one pixel unit or correspond to more pixel units, and the embodiments of the present disclosure are not limited in this aspect.

In the process in which the power supply voltage ELVDD is applied to each of the first pixel units 104 through the first power lines 220 of each mesh structure 2201, each of the first power lines 220 may be directly connected to a transistor in the first pixel unit 104, or may be electrically connected to the first pixel unit 104 through a via hole. In the following description, the electrical connection of the first power line 220 to the first pixel unit 104 through a via hole is taken as an example to describe the structure of the first pixel unit 104 of the display panel 20 in the embodiments of the present disclosure, but the embodiments of the present disclosure are not limited in this aspect, and the technical effects of the embodiments of the present disclosure are not affected. The following embodiments are the same with that, and details are not described again.

Figure 4:
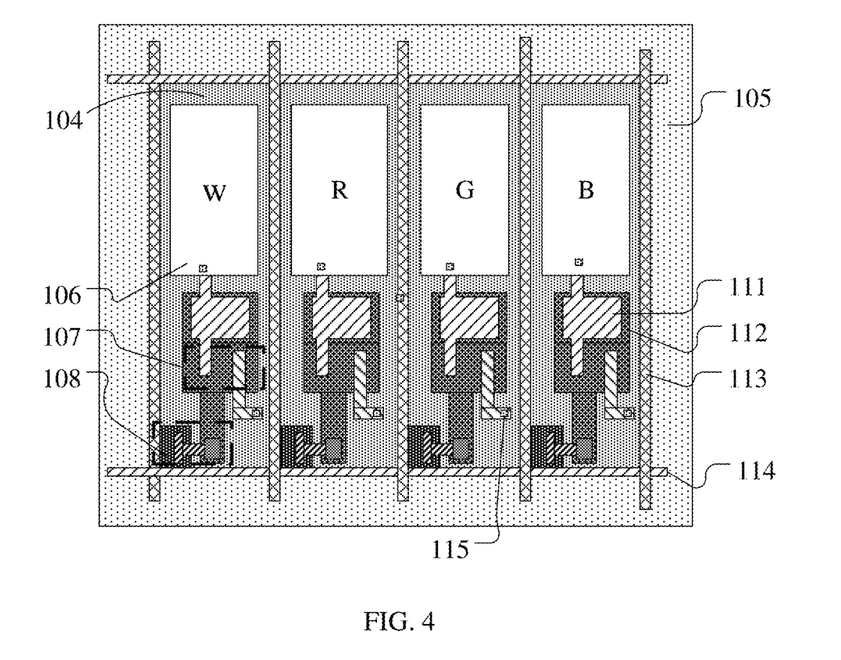
FIG. 4 is a schematic diagram of a planar structure of first pixel units of a display panel provided by some embodiments of the present disclosure.

FIG. 4 is a schematic diagram of a planar structure of the first pixel units 104 of the display panel 20 provided by some embodiments of the present disclosure. As illustrated in FIG. 4, each first pixel unit 104 is disposed in a region defined by the data line 113 and the gate line 114 on the base substrate 105. Each first pixel unit 104 includes an OLED component 106, a driving transistor 107, and a switching transistor 108, the switching transistor 108 is connected to the data line 113 and the gate line 114, the driving transistor 107 is connected to the switching transistor 108 and the OLED component 106, and the arrangement of the driving transistor 107 and the switching transistor 108 may be with reference to the corresponding dashed block illustrated in FIG. 4. An insulating layer (not shown in FIG. 4) is provided between the first power line 220 and the first pixel units 104, first via hole structures 115 are provided in the insulating layer, and the first power line 220 is connected to the driving transistor 107 of each of the first pixel units 104 through the first via hole structure 115, so as to provide the power supply voltage ELVDD to each of the first pixel units 104.

Each first pixel unit 104 further includes a storage capacitor, and the storage capacitor includes a first electrode 111 and a second electrode 112 which are opposite to each other. As illustrated in FIG. 4, both the first electrode 111 and the second electrode 112 are in a block shape, and a dielectric layer formed of an insulating material is provided between the first electrode 111 and the second electrode 112. For example, the first electrode 111 is connected to the drain electrode of the driving transistor 107, and the second electrode 112 is connected to the drain electrode of the switching transistor 108.

It should be noted that although FIG. 4 illustrates only four first pixel units 104 in a parallel arrangement and the four first pixel units are configured to emit white light (W), red light (R), green light (G), and blue light (B), respectively, those skilled in the art should understand that the first pixel units 104 included in the display panel 20 provided by some embodiments of the present disclosure are not limited to the four illustrated, but may include more. In the embodiments illustrated in FIG. 4, each pixel unit includes two thin film transistors, and in other embodiments, each pixel unit may further include more thin film transistors, such as a reset thin film transistor, a compensation thin film transistor, a light-emitting control thin film transistor, etc. The embodiments of the present disclosure are not limited in this aspect. In addition, in some other embodiments, in addition to the data lines 113 and the gate line 114 in the display panel 20, the display panel 20 may further include a detection compensation line connecting the first pixel unit 104 to a detection integrated circuit. The detection compensation line may also be located in the display region of the display panel 20 for detecting the electrical performance of, for example, the driving transistor or the OLED component, and the embodiments of the present disclosure are not limited in this aspect.

The driving transistor 107 illustrated in FIG. 4 may be a bottom-gate thin film transistor or a top-gate thin-film transistor. Hereinafter, the driving transistor 107 being a top-gate thin-film transistor is taken as an example for description of the connection of the first pixel unit 104 to the first power line 220.

Figure 5:
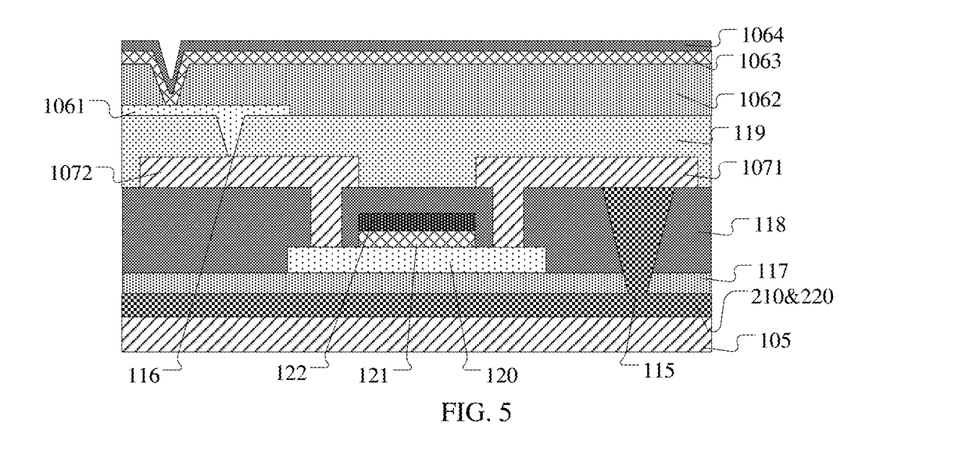
FIG. 5 is a schematic diagram of a partial cross-sectional structure of a display panel provided by some embodiments of the present disclosure.

FIG. 5 is a schematic diagram of a partial cross-sectional structure of the display panel 20 provided by some embodiments of the present disclosure, and for example, this structure may correspond to the situation illustrated in FIG. 4. With reference to FIG. 4 and FIG. 5, the first power bus 210, the first power line 220, the switching transistor 108 (not shown in FIG. 5), the driving transistor 107, and the OLED component 106 are provided on the base substrate 105 of the display panel 20. As illustrated in FIG. 5, the first power bus 210 and the first power line 220 are disposed below the first pixel unit 104, thereby avoiding that the wiring of the power supply voltage ELVDD occupies an opening region and a capacitor region of the pixel, and increasing the opening ratio of the pixel region of the display panel. For example, part of the first power bus 210 and the first power line 220 may also be disposed above some layer structures of the first pixel unit 104, and the embodiments of the present disclosure are not limited in this aspect.

For example, as illustrated in FIG. 5, a first insulating layer 117 is further provided on the base substrate 105, an active layer 120 of the driving transistor 107 is provided on the first insulating layer 117, a gate insulating layer 121, a gate metal layer 122, and a second insulating layer 118 are sequentially provided on the active layer 120, and a source electrode 1071 and a drain electrode 1072 are provided on the second insulating layer 118. The first via hole structure 115 is provided in the first insulating layer 117 and the second insulating layer 118, and the first power line 220 is electrically connected to the source electrode 1071 of the driving transistor 107 through the first via hole structure 115. It should be noted that, in the process of forming the source electrode 1071 and the drain electrode 1072 by a patterning process, according to different materials of the active layer 120, if the active layer 120 is easily affected, an etching barrier layer may be further provided on the active layer 120. The embodiments of the present disclosure are not limited in this aspect.

Figure 6:
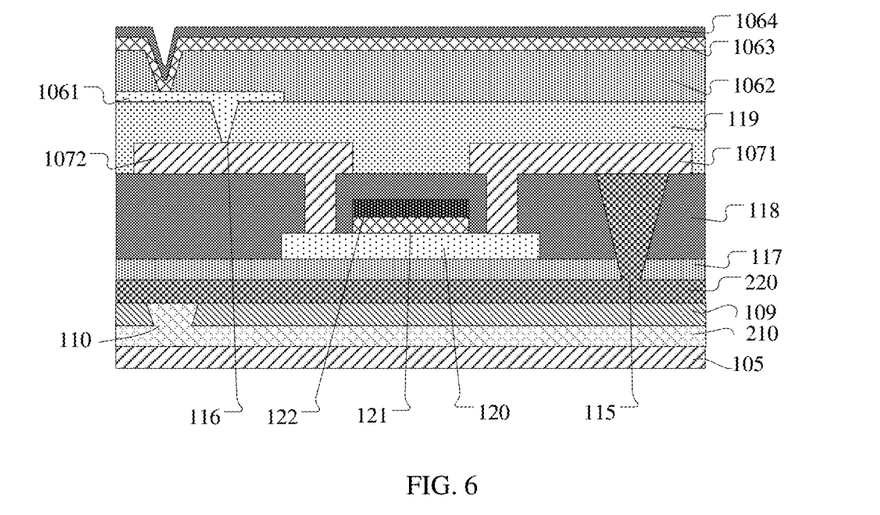
FIG. 6 is a schematic diagram of a partial cross-sectional structure of another display panel provided by some embodiments of the present disclosure.

For example, as illustrated in FIG. 5, the first power bus 210 and the first power line 220 may be formed in the same layer with respect to the base substrate 105. The first power line 220 is electrically connected to the source electrode 1071 of the driving transistor 107 through the first via hole structure 115, so that the power source voltage ELVDD provided from the first power bus 210 is applied to the source electrode 1071 of the driving transistor 107. Alternatively, as illustrated in FIG. 6, the first power bus 210 and the first power line 220 may also be formed in different layers with respect to the base substrate 105. A third insulating layer 109 is provided between the first power bus 210 and the first power line 220, a third via hole structure 110 is provided in the third insulating layer 109, and the first power bus 210 is connected to the first power line 220 through the third via hole structure 110, so that the power supply voltage ELVDD is transmitted to the first power line 220. The first power line 220 is electrically connected to the source electrode 1071 of the driving transistor 107 through the first via hole structure 115, and the power supply voltage ELVDD provided from the first power bus 210 is applied to the source electrode 1071 of the driving transistor 107.

For example, as illustrated in FIG. 5, the OLED component 106 is provided on the driving transistor 107, and a passivation layer 119 is provided on the source electrode 1071 and the drain electrode 1072 of the driving transistor 107. A second via hole structure 116 is provided in the passivation layer 119, and an anode 1061 of the OLED component 106 is electrically connected to the drain electrode 1072 of the driving transistor 107 through the second via hole structure 116, so as to provide a light-emitting current to the OLED component 106. Here, the anode 1061 of the OLED component 106 may also be referred to as a pixel electrode, and the pixel electrode of each pixel unit is insulated from each other. A pixel definition layer 1062 is provided on the anode 1061 of the OLED component 106, a light-emitting layer 1063 is provided on the pixel definition layer 1062, and a cathode 1064 of the OLED component 106 is provided on the light-emitting layer 1063. For example, the cathode 1064 of the OLED component 106 is a common cathode to provide another power supply voltage ELVSS, such as a negative voltage or a grounded voltage.

It should be noted that each pixel definition region of the pixel definition layer 1062 corresponds to a pixel electrode, and each column of sub-pixel definition regions in the pixel definition structure are sub-pixel definition regions of the same color. For example, as illustrated in FIG. 4, the sub-pixel definition region includes a white sub-pixel definition region W, a red sub-pixel definition region R, a green sub-pixel definition region G, and a blue sub-pixel definition region B. For example, one sub-pixel definition region is connected to an adjacent sub-pixel definition region of the same color, and each sub-pixel definition region is connected to at most two adjacent sub-pixel definition regions of the same color.

For example, the base substrate 105 may be a transparent glass substrate or a transparent plastic substrate.

For example, the material of the first power line 220, the gate metal layer 122, the data line 113, the gate line 114, the source electrode 1071, and the drain electrode 1072 may be a copper-based metal, for example, copper (Cu), copper-molybdenum alloy (Cu/Mo), copper-titanium alloy (Cu/Ti), copper-molybdenum-titanium alloy (Cu/Mo/Ti), copper-molybdenum-wolfram alloy (Cu/Mo/W), copper-molybdenum-niobium alloy (Cu/Mo/Nb), etc., or may be also a chromium-based metal, for example, chromium-molybdenum alloy (Cr/Mo), chromium-titanium alloy (Cr/Ti), chromium-molybdenum-titanium alloy (Cr/Mo/Ti), or other suitable materials.

For example, the active layer 120 is formed of a semiconductor material, such as amorphous silicon, microcrystalline silicon, polycrystalline silicon, an oxide semiconductor, etc. The oxide semiconductor material may be indium gallium zinc oxide (IGZO), zinc oxide (ZnO), etc. The regions, in contact with the source electrode 1071 and the drain electrode 1072, of the active layer 120 can be conductive by the processes of plasma processing and high temperature processing, so that the transmission of electrical signals can be better implemented.

For example, the first insulating layer 117, the second insulating layer 118, and the pixel definition layer 1062 are generally formed by using an organic insulating material (for example, acrylic resin) or an inorganic insulating material (for example, silicon nitride (SiNx) or silicon oxide (SiOx)). For example, each of the first insulating layer 117 and the second insulating layer 118 may be a single-layer structure composed of silicon nitride or silicon oxide, or a double-layer structure composed of silicon nitride and silicon oxide. For example, the first insulating layer 117 generally includes two or more layers, so that the parasitic capacitance between the power line 220 and metal lines in other layers can be reduced.

For example, the material used for the gate insulating layer 121 includes silicon nitride (SiNx), silicon oxide (SiOx), aluminum oxide ($Al_2O_3$), aluminum nitride (AlN), or other suitable materials. The material used for the passivation layer 119 includes silicon nitride (SiNx), silicon oxide (SiOx), silicon oxynitride (SiNxOy), or an acrylic resin.

For example, in the OLED component 106, in order to effectively inject electrons or holes into the light-emitting layer 1063, the injected energy barrier needs to be reduced. Most of the organic materials used for the OLED component have a LUMO energy level of 2.5 Ev~3.5 Ev, and a HOMO energy level of 5 Ev~6 Ev. Therefore, the cathode 1064 may be made of a metal with a low work function, and the anode 1061 may be made of a transparent material with a high work function. The material of the anode 1061 of the OLED component 106 includes indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO), carbon nanotubes, etc. The material of the cathode 1064 of the OLED component 106 includes magnesium aluminum alloy (MgAl), lithium aluminum alloy (LiAl), or single metal such as magnesium, aluminum, or lithium. The material of the light-emitting layer 1063 of the OLED component 106 may be selected according to the color of the emitted light, and the material of the light-emitting layer 1063 includes a fluorescent light-emitting material or a phosphorescent light-emitting material. Currently, a doping system is generally used, that is, a doping material is mixed into a host light-emitting material to obtain an available material. For example, the host light-emitting material may be a metal compound material, a derivative of anthracene, an aromatic diamine compound, a triphenylamine compound, an aromatic triamine compound, a biphenyl diamine derivative, or a triarylamine polymer.

Figure 7:
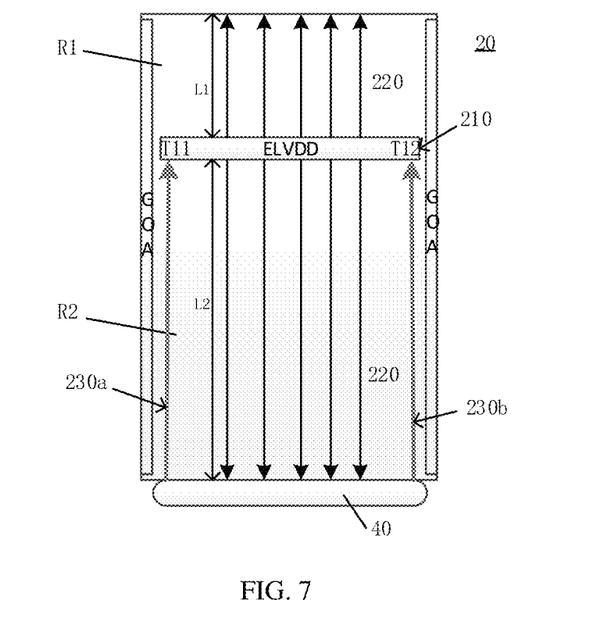
FIG. 7 is a schematic planar diagram of a specific example of another power supply wiring design of a display panel provided by some embodiments of the present disclosure.

FIG. 7 is a schematic planar diagram of a specific example of another power supply wiring design of the display panel 20 provided by some embodiments of the present disclosure. As illustrated in FIG. 7, the size L1, in the direction perpendicular to the extending direction of the first power bus 210, of the first region R1 may be different from the size L2, in the direction perpendicular to the extending direction of the first power bus 210, of the second region R2, that is, the position where the power supply voltage ELVDD is provided has different distances from the top and bottom of the display panel 20, and for example, the value of L2 may be twice the value of L1. The power supply voltage ELVDD is transmitted to the top and bottom of the display panel 20 through the first power line 220 after being applied to the first terminal T1 and the second terminal T2 of the first power bus 210. Therefore, compared with the display panel 10 with the power supply wiring design illustrated in FIG. 1, the power supply wiring design in this example can also implement the technical effect of reducing the transmission path of the power supply voltage ELVDD in the display region, thereby reducing the voltage drop of the power supply voltage ELVDD during the transmission, effectively alleviating the luminance attenuation of the display region caused by the voltage attenuation during the transmission of the power supply voltage ELVDD, improving the luminance uniformity of the display region, and acquiring a better display image.

Figure 8:
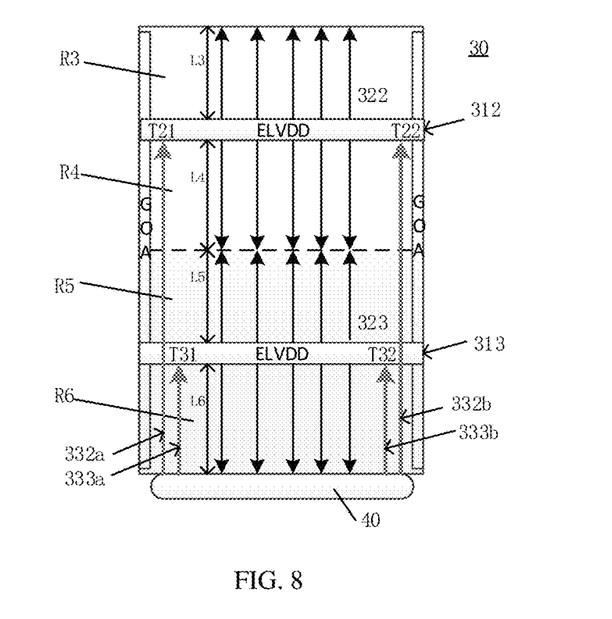
FIG. 8 is a schematic planar diagram of a power supply wiring design of another display panel provided by some embodiments of the present disclosure.

FIG. 8 is a schematic planar diagram of a power supply wiring design of another display panel 30 provided by some embodiments of the present disclosure. As illustrated in FIG. 8, the display panel 30 includes a second power bus 312, a third power bus 313, a second power line 322, a third power line 323, a second power input line 332, a third power input line 333, and a power management circuit 40. The second power bus 312 is substantially parallel to the third power bus 313, and the second power line 322 is substantially parallel to the third power line 323. A display region of the display panel 30 includes a third region R3, a fourth region R4, a fifth region R5, and a sixth region R6, the gate driving circuits (GOA driving circuits), and the like are provided in a peripheral region on both sides of the display region. In the present disclosure, the expression "A is substantially parallel to B" includes the case where a small angle (for example, 10 degrees or 5 degrees) is between an extending direction of A and an extending direction of B, and the case where the extending direction of A is parallel to the extending direction of B.

The second power bus 312 is located between the third region R3 and the fourth region R4, and the third power bus 313 is located between the fifth region R5 and the sixth region R6. A first terminal T21 and a second terminal T22 of the second power bus 312 are connected to the power management circuit 40 located in the FPC bonding region through the second power input lines 332a and 332b, respectively. A first terminal T31 and a second terminal T32 of the third power bus 313 are connected to the power management circuit 40 located in the bonding region through the third power input lines 333a and 333b, respectively, so that the power supply voltage ELVDD provided by the power management circuit 40 is transmitted to the second power bus 312 and the third power bus 313. The second power line 322 is electrically connected to the second power bus 312 and extends from the second power bus 312 to the third region R3 and the fourth region R4, respectively. The third power line 323 is electrically connected to the third power bus 313 and extends from the third power bus 313 to the fifth region R5 and the sixth region R6, respectively, so that the power supply voltage ELVDD is provided from two different positions of the display region and then extends in a direction perpendicular to the second power bus 312 and the third power bus 313, respectively, so as to cover the entire display region of the display panel 30. Therefore, compared with the display panel 20 illustrated in FIG. 2 or FIG. 7, the power supply wiring design of the display panel 30 provided by the embodiments allows the transmission path of the power supply voltage ELVDD in the display region to be further reduced, and allows the voltage drop of the power supply voltage ELVDD to be smaller during the transmission, thereby further alleviating the luminance attenuation of the display region caused by the attenuation of the power supply voltage ELVDD during the transmission, allowing the luminance of the display region to be more uniform, and achieving a better display effect.

It should be noted that, a size L3, in the direction perpendicular to the extending direction of the second power bus 312, of the third region R3, a size L4, in the direction perpendicular to the extending direction of the second power bus 312, of the fourth region R4, a size L5, in the direction perpendicular to the extending direction of the third power bus 313, of the fifth region R5, and a size L6, in the direction perpendicular to the extending direction of the third power bus 313, of the sixth region R6 are not limited in the embodiments. For example, the values of L3, L4, L5, and L6 may be the same as each other or different from each other, and the embodiments of the present disclosure are not limited in this aspect.

In the embodiments, the third region R3, the fourth region R4, the fifth region R5, and the sixth region R6 of the display panel 30 include a plurality of second pixel units, respectively, and each of the second pixel units is connected to the second power line 322 extending to the third region R3 and the fourth region R4, and the third power line 323 extending to the fifth region R5 and the sixth region R6, respectively. A plurality of second power lines 322 and a plurality of third power lines 323 include a plurality of mesh structures, which are the same as the mesh structures of the first power lines 220 illustrated in FIG. 3, respectively, and the connection of the power supply wiring of the display panel 30 to each second pixel unit in the display region is the same as the connection of the power supply wiring of the display panel 20 to each first pixel unit in the display region illustrated in FIG. 3 to FIG. 6. Details are not described herein again.

Some embodiments of the present disclosure further provide a method for manufacturing a display panel, including: forming a power bus and a power line on the display panel, and forming a plurality of pixel units in a display region of the display panel. The display region includes a first region and a second region, the power bus is between the first region and the second region, and the power line extends from the power bus to the first region and the second region, respectively, so as to supply power to the plurality of pixel units in the first region and the second region, respectively.

The method for manufacturing the display panel provided by some embodiments of the present disclosure further includes: forming a power input line for connecting the power bus to a power management circuit on the display panel. The power management circuit is configured to provide a power supply voltage to the power input line.

Figure 9:
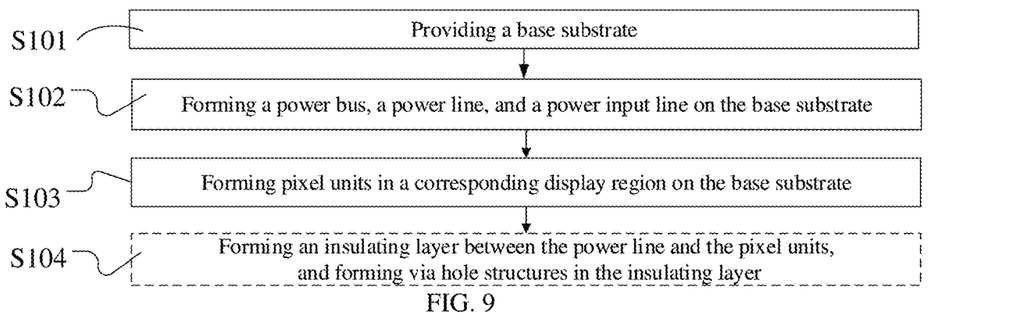
FIG. 9 is a flowchart of a method for manufacturing a display panel provided by some embodiments of the present disclosure.

FIG. 9 is a flowchart of a method for manufacturing a display panel provided by some embodiments of the present disclosure. The manufacturing method includes the following steps S101 to S103.

Step S101: providing a base substrate.

Step S102: forming a power bus, a power line, and a power input line on the base substrate.

Step S103: forming pixel units in a corresponding display region on the base substrate.

For example, each pixel unit includes a transistor, a capacitor, and a light-emitting component. The light-emitting component may be an OLED, a PLED, etc. The power line may be directly connected to a transistor (such as a driving transistor) in the pixel unit, or may be electrically connected to the pixel unit by forming a via hole. Therefore, as illustrated in FIG. 9, in some embodiments, the method for manufacturing the display panel may further include the following step S104.

Step S104: forming an insulating layer between the power line and the pixel units, and forming via hole structures in the insulating layer.

For example, the power line and the power bus may be formed in the same layer with respect to the base substrate, or the power line and the power bus may be formed in different layers with respect to the base substrate and are electrically connected to each other by forming a via hole.

Figure 10:
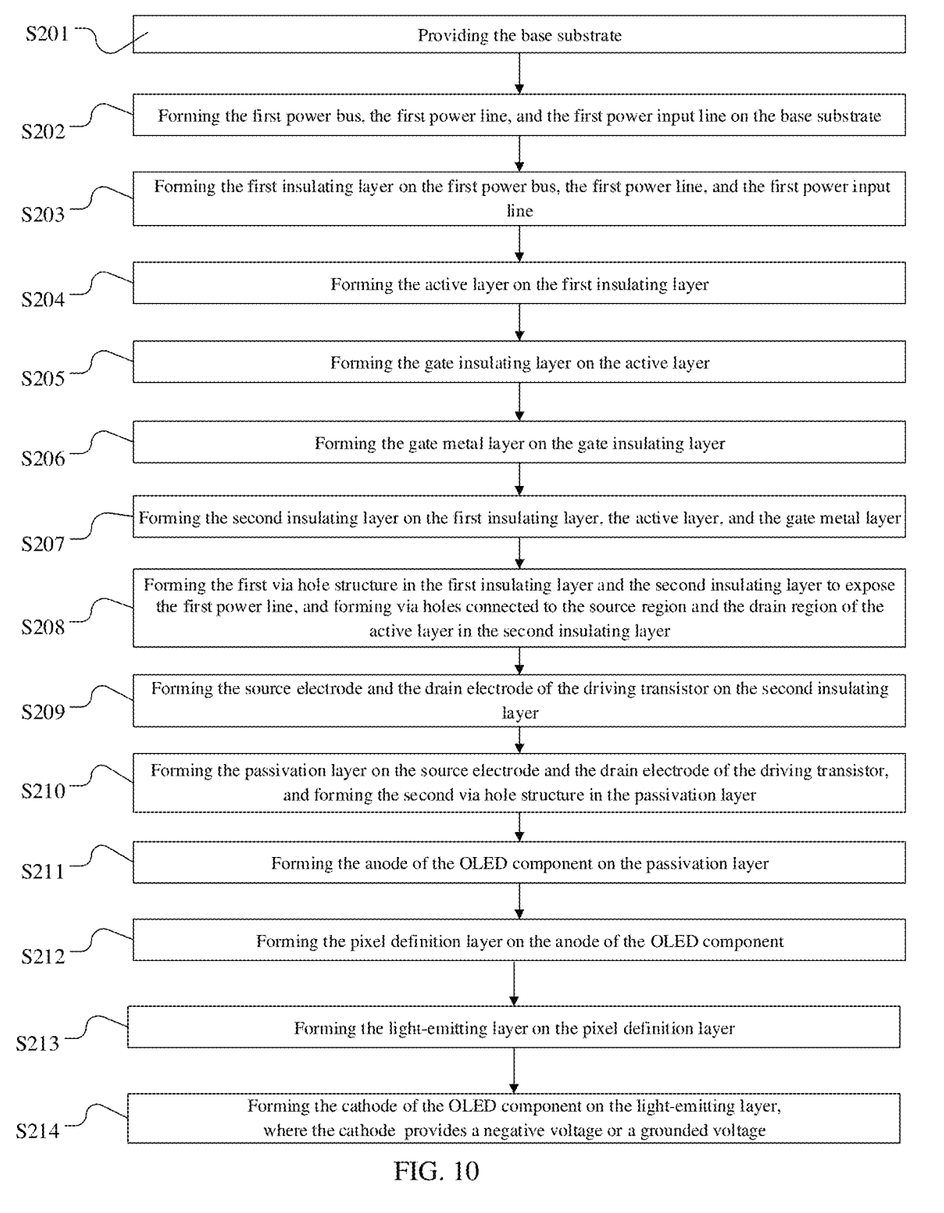
FIG. 10 is a flowchart of a specific example of a method for manufacturing a display panel provided by some embodiments of the present disclosure.

In the following, the structure of the display panel 20 illustrated in FIG. 5 is taken as an example for specific description of the method for manufacturing the display panel provided by the embodiments of the present disclosure. FIG. 10 is a flowchart of a specific example of a method for manufacturing the display panel 20 provided by some embodiments of the present disclosure. The manufacturing method includes the following steps.

Step S201: providing the base substrate 105. For example, the base substrate 105 may be a glass substrate, a plastic substrate, etc.

Step S202: forming the first power bus 210, the first power line 220, and the first power input line 230 on the base substrate 105. For example, a conductive thin film (such as a metal thin film) is formed on the base substrate 105 by a method such as deposition or the like, and then the first power bus 210, the first power line 220, and the first power input line 230 are formed by a patterning method (such as a photolithography method).

Step S203: forming the first insulating layer 117 on the first power bus 210, the first power line 220, and the first power input line 230. For example, the first insulating layer 117 is formed by a physical vapor deposition method, a chemical vapor deposition method, or a coating method, and the first insulating layer 117 may be an inorganic insulating layer or an organic insulating layer.

Step S204: forming the active layer 120 on the first insulating layer 117. The active layer 120 may be formed of amorphous silicon, polycrystalline silicon, an oxide semiconductor, etc., and is patterned by, for example, a photolithography process.

Step S205: forming the gate insulating layer 121 on the active layer 120. For example, the gate insulating layer 121 is formed by a physical vapor deposition method, a chemical vapor deposition method, or a coating method. The gate insulating layer 121 may be an inorganic insulating layer or an organic insulating layer.

Step S206: forming the gate metal layer 122 on the gate insulating layer 121. For example, the gate metal layer 122 and the gate insulating layer 121 may be patterned by using the same one patterning process. For example, the gate metal layer 122 may be formed of molybdenum or molybdenum alloy, aluminum or aluminum alloy, copper or copper alloy, etc.

Step S207: forming the second insulating layer 118 on the first insulating layer 117, the active layer 120, and the gate metal layer 122. For example, the second insulating layer 118 is formed by a physical vapor deposition method, a chemical vapor deposition method, or a coating method, and the second insulating layer 118 may be an inorganic insulating layer or an organic insulating layer.

Step S208: forming the first via hole structure 115 in the first insulating layer 117 and the second insulating layer 118 to expose the first power line 220, and forming via holes connected to the source region and the drain region of the active layer 120 in the second insulating layer 118. In the embodiments, the first via hole structure 115 passes through not only the first insulating layer 117 but also the second insulating layer 118.

Step S209: forming the source electrode 1071 and the drain electrode 1072 of the driving transistor 107 on the second insulating layer 118. The first power line 220 is connected to the source electrode 1071 of the driving transistor 107 through the first via hole structure 115, and the source electrode 1071 and the drain electrode 1072 of the driving transistor 107 are connected to the source region and the drain region of the active layer 120 through the via holes, respectively.

Step S210: forming the passivation layer 119 on the source electrode 1071 and the drain electrode 1072 of the driving transistor 107, and forming the second via hole structure 116 in the passivation layer 119. For example, the passivation layer 119 is formed by a physical vapor deposition method, a chemical vapor deposition method, or a coating method. The passivation layer 119 may be an inorganic insulating layer or an organic insulating layer, and then the second via hole structure 116 is formed by a photolithography process. The second via hole structure 116 exposes the drain electrode 1072 of the driving transistor 107.

Step S211: forming the anode 1061 of the OLED component 106 on the passivation layer 119. The anode 1061 of the OLED component 106 is electrically connected to the drain electrode 1072 of the driving transistor 107 through the second via hole structure 116, so as to provide the light-emitting current to the OLED component 106. For example, the anode 1061 is, for example, an ITO layer, and is formed by, for example, chemical vapor deposition.

Step S212: forming the pixel definition layer 1062 on the anode 1061 of the OLED component 106. The pixel definition layer 1062 is formed by a physical vapor deposition method, a chemical vapor deposition method, or a coating method. The pixel definition layer 1062 may be an inorganic insulating layer or an organic insulating layer. Then, the pixel definition layer 1062 is patterned by a photolithographic process to expose a part of the anode 1061.

Step S213: forming the light-emitting layer 1063 on the pixel definition layer 1062. For example, the light-emitting layer 1063 is formed by an ink-jet printing method.

Step S214: forming the cathode 1064 of the OLED component 106 on the light-emitting layer 1063. The cathode 1064 provides a negative voltage or a grounded voltage. For example, the cathode 1064 is formed by a sputtering method, and the cathode 1064 may be formed of magnesium or magnesium alloy.

The method for manufacturing the display panel in other embodiments is similar to the above methods, and details are not described herein again.

Figure 11:
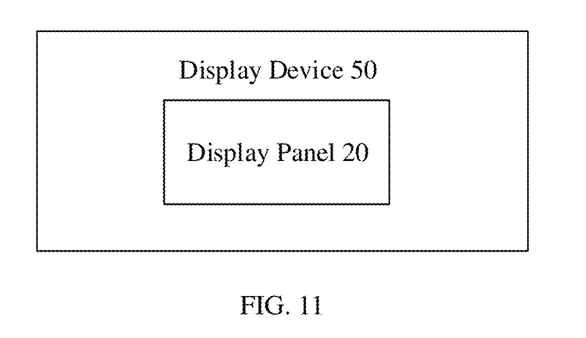
FIG. 11 is a schematic block diagram of a display device provided by some embodiments of the present disclosure.

FIG. 11 is a schematic block diagram of a display device 50 provided by some embodiments of the present disclosure. The display device 50 includes the display panel according to any one of the embodiments of the present disclosure.

For example, the display device 50 may include the display panel 20 illustrated in FIG. 2 or FIG. 7, or may include the display panel 30 illustrated in FIG. 8. The technical effects and implementation principles of the display device 50 are the same as those of the display panel provided by the embodiments of the present disclosure, and details are not described herein again. For example, the display device 50 may be any product or component with a display function, such as a liquid crystal panel, an electronic paper, an OLED panel, a mobile phone, a tablet computer, a television, a display, a notebook computer, a digital photo frame, a navigator, etc.

The following statements should be noted:

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. However, it should be understood that, in the case where a component such as a layer, a film, a region, a substrate, or the like is referred to be "on" or "under" another component, the component may be "directly" "on" or "under" the another component, or an intermediate component may be disposed therebetween.

(3) In case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

What is claimed is:

1. A display panel, comprising one first power bus and a first power line,
    wherein a display region of the display panel comprises a first region and a second region, the first region and the second region comprise a plurality of first pixel units, respectively,
    the first power bus is between the first region and the second region,
    in a direction perpendicular to an extending direction of the first power bus, the display panel comprises two opposite sides,
    the first power line is electrically connected to the first power bus, and
    the first power line extends, in different directions and towards the two opposite sides of the display panel, from the first power bus to the first region and the second region, respectively, and further extends in the first region and the second region, so as to be electrically connected to the first pixel units in the first region and the first pixel units in the second region, respectively; and
    the display panel further comprises a power management circuit and a first power input line, the first power input line connects the first power bus to the power management circuit, the power management circuit is configured to provide a power supply voltage to the first power input line, the first power line is configured to receive the power supply voltage provided by the power management circuit only through the first power bus between the first region and the second region, and the first pixel units in the first region and the first pixel units in the second region are respectively on both sides of the first power bus.

2. The display panel according to claim 1, wherein the first pixel units comprised in the first region and the first pixel units comprised in the second region are identical in number.

3. The display panel according to claim 1, wherein the first power input line connects a first terminal and a second terminal, which are opposite to each other, of the first power bus to the power management circuit, respectively.

4. The display panel according to claim 3, further comprising a base substrate,
    wherein the first power bus, the first power line, the first power input line, and the first pixel units are on the base substrate, and
    the first power line and the first power bus are formed in an identical layer with respect to the base substrate.

5. The display panel according to claim 3, further comprising a base substrate,
    wherein the first power bus, the first power line, the first power input line, and the first pixel units are on the base substrate, and
    the first power line and the first power bus are formed in different layers with respect to the base substrate and are electrically connected to each other through a via hole.

6. The display panel according to claim 1, wherein an insulating layer is provided between the first power line and the plurality of first pixel units, via hole structures are provided in the insulating layer, and
    the first power line is connected to the plurality of first pixel units through the via hole structures, respectively.

7. The display panel according to claim 1, further comprising a plurality of first power lines,
    wherein in the first region and the second region, the plurality of first power lines are electrically connected to each other to form at least one mesh structure.

8. A display panel, comprising one first power bus, one second power bus, a first power line, and a second power line,
    wherein a display region of the display panel comprises a first region and a second region, the first region and the second region comprise a plurality of first pixel units, respectively, the first power bus is between the first region and the second region, and the first power line is electrically connected to the first power bus and extends, in different directions, from the first power bus to the first region and the second region, respectively, so as to be electrically connected to the first pixel units in the first region and the first pixel units in the second region, respectively;
    the display region further comprises a third region and a fourth region, the third region and the fourth region comprise a plurality of second pixel units, respectively,
    the second power bus is between the third region and the fourth region,
    the second power line is electrically connected to the second power bus and extends, in different directions, from the second power bus to the third region and the fourth region, respectively, so as to be electrically connected to the second pixel units in the third region and the second pixel units in the fourth region, respectively, and
    the second pixel units in the third region and the second pixel units in the fourth region are respectively on both sides of the second power bus; and
    the first power line is electrically connected to the plurality of first pixel units to provide a power supply voltage, and the second power line is electrically connected to the plurality of second pixel units to provide the power supply voltage.

9. The display panel according to claim 8, wherein the first power bus is substantially parallel to the second power bus, and the first power line is substantially parallel to the second power line.

10. The display panel according to claim 9, further comprising a power management circuit, a first power input line, and a second power input line, wherein the first power input line connects the first power bus to the power management circuit, the power management circuit is configured to provide the power supply voltage to the first power input line, the second power input line connects the second power bus to the power management circuit, and the power management circuit is further configured to provide the power supply voltage to the second power input line.

11. The display panel according to claim 10, wherein the first power input line connects a first terminal and a second terminal, which are opposite to each other, of the first power bus to the power management circuit, respectively, and the second power input line connects a first terminal and a second terminal, which are opposite to each other, of the second power bus to the power management circuit, respectively.

12. The display panel according to claim 8, further comprising a plurality of first power lines and a plurality of second power lines, wherein in the first region and the second region, the plurality of first power lines are electrically connected to each other to form at least one mesh structure, and in the third region and the fourth region, the plurality of second power lines are electrically connected to each other to form at least one mesh structure.

13. A method for manufacturing a display panel, comprising:

forming a power bus and a power line on the display panel, forming a plurality of pixel units in a display region of the display panel, and forming a power input line, for connecting the power bus to a power management circuit, on the display panel, wherein the display region comprises a first region and a second region, the power bus is between the first region and the second region, in a direction perpendicular to an extending direction of the power bus, the display panel comprises two opposite sides, and the power line extends, in different directions and towards the two opposite sides of the display panel, from the power bus to the first region and the second region, respectively, and further extends in the first region and the second region, so as to be electrically connected to pixel units in the first region and pixel units in the second region, respectively; and the power management circuit is configured to provide a power supply voltage to the power input line, the power line is configured to receive the power supply voltage provided by the power management circuit only through the power bus between the first region and the second region, and the pixel units in the first region and the pixel units in the second region are respectively on both sides of the power bus.

14. The method for manufacturing the display panel according to claim 13, further comprising:

providing a base substrate, wherein the power bus, the power line, the power input line, and the pixel units are formed on the base substrate; and the power line and the power bus are formed in an identical layer with respect to the base substrate, or the power line and the power bus are formed in different layers with respect to the base substrate and are electrically connected to each other through a via hole.

15. The display panel according to claim 7, wherein each of the at least one mesh structure corresponds to one first pixel unit.

16. The display panel according to claim 8, wherein in a direction perpendicular to an extending direction of the first power bus, a size of the first power line extending in the first region is identical to a size of the first power line extending in the second region; and in a direction perpendicular to an extending direction of the second power bus, a size of the second power line extending in the third region is identical to a size of the second power line extending in the fourth region.

* * * * *